US 6,457,515 B1
United States Patent
Vafai et al.

(10) Patent No.: US 6,457,515 B1
(45) Date of Patent: Oct. 1, 2002

(54) TWO-LAYERED MICRO CHANNEL HEAT SINK, DEVICES AND SYSTEMS INCORPORATING SAME

(75) Inventors: Kambiz Vafai, Columbus, OH (US); Lu Zhu, Canton, MI (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 09/369,564

(22) Filed: Aug. 6, 1999

(51) Int. Cl.[7] .............................. F28F 7/00; F28F 3/12; H05K 7/20
(52) U.S. Cl. ..................... 165/80.4; 165/168; 361/699
(58) Field of Search ............................... 165/80.4, 168; 361/699

(56) References Cited

U.S. PATENT DOCUMENTS

| | | | | |
|---|---|---|---|---|
| 3,708,223 A | * | 1/1973 | Sorensen et al. | 165/168 |
| 3,884,558 A | * | 5/1975 | Dunn, III et al. | 359/845 |
| 4,098,279 A | * | 7/1978 | Golden | 607/104 |
| 4,120,021 A | * | 10/1978 | Roush | 165/80.4 |
| 5,005,640 A | * | 4/1991 | Lapinski et al. | 165/80.4 |
| 5,099,910 A | * | 3/1992 | Walpole et al. | 165/80.4 |
| 5,203,401 A | * | 4/1993 | Hamburgen et al. | 165/80.4 |
| 5,263,536 A | * | 11/1993 | Hulburd et al. | 165/80.4 |
| 5,611,214 A | * | 3/1997 | Wegeng et al. | 165/185 |
| 5,901,037 A | * | 5/1999 | Hamilton et al. | 165/80.4 |
| 5,903,583 A | * | 5/1999 | Ullman et al. | 372/35 |

OTHER PUBLICATIONS

Missaggia et al., Microchannel Heath Sinks for Two Dimmensional High–Power–Density Diode Laser Arrays, IEEE Journal of Quantum Electronics 25, 1988–1992 (1989).
Weisberg et al., Analysis of Microchannels for Integrated Cooling, Int. J. Heat & Mass Transfer 35, 2465–74 (1992).
Tuckerman et al., High–Performance Heat Sinking for VLSI, IEEE Electron Device Letter ED–2, 126–129, (1981).
Samalam, Convective Heat Transfer in Microchannels, J. of Electronics Materials 18, 611–17 (1989).
Bowers et al., Two–Phase Electronic Cooling Using Mini–Channel and Micro–Channel Heat Sinks: Part 1–to Design Criteria and Heat Diffusion Constraints, Trans. of the ASME, J. of Electronic Packaging 116, 290–7 (1994).
Knight et al., Heat Sink Optimization with Application to Microchannels, IEEE Trans. Components, Hybrids and Manufacturing Technology 15, 832–42 (1992).
Kleiner et al., High Performance Forced Air Cooling Scheme Employing Microchannel Heat Exchangers, IEEE Trans. on Components, Packaging and Manufacturing Technology Part A 18, 795–804 (1995).

* cited by examiner

*Primary Examiner*—Henry Bennett
*Assistant Examiner*—Tho Van Duong
(74) *Attorney, Agent, or Firm*—Standley & Gilcrest LLP

(57) ABSTRACT

The present invention includes heat sinks, heat sink devices, and heat sink systems. The invention also includes machines or electronic devices using these aspects of the invention. The present invention also includes in broadest terms, an electronic device in thermal contact with a two-layered micro-channeled heat sink device.

14 Claims, 10 Drawing Sheets

TWO-LAYERED MICRO CHANNEL HEAT SINK, DEVICES AND SYSTEMS INCORPORATING SAME

TECHNICAL FIELD OF THE INVENTION

The present invention is in the field of electronic cooling.

BACKGROUND OF THE INVENTION

This invention relates to a heat sink apparatus useful in electronic devices. More specifically, this invention relates to removing heat from microelectronics that are useful in computerized devices.

The heat removal problem has become an important factor in the advancement of microelectronics due to both drastically increased integration density of chips in digital devices as well as an increased current-voltage handling capability of power electronic devices. The task of removing a large amount of dispersed heat from a constrained, small space is often beyond the capability of conventional cooling techniques. New methods with heat removal capabilities at least one order larger than that of conventional ones are therefore required.

The present invention is based on a two-layer micro-channel heat sink design. Micro-channel heat sink has been studied and tested as a high performance and compact cooling scheme in microelectronics cooling applications. It is shown that the thermal resistance as low as 0.03° C./W is obtainable for micro-channel heat sinks, which is substantially lower than the conventional channel-sized heat sinks. Design factors that have been studied include coolant selection (air and liquid coolant), inclusion of phase change (one phase and two phase), and structural optimization.

One drawback of micro-channel heat sink is the relatively higher temperature rise along the micro-channels compared to that for the traditional heat sink designs. In the micro-channel heat sink, the large amount of heat generated by the semiconductor chips is carried out from the package by a relatively small amount of coolant so the coolant exits at a relatively high temperature.

This undesirable temperature gradient is an important consideration in the design of an electronic cooling scheme. A large temperature rise produces thermal stresses in chips and packages due to the coefficient of thermal expansion (CTE) mismatch among different materials thus undermining device reliability. Furthermore, a large temperature gradient is undesirable for the electrical performance since many electrical parameters are adversely affected by a substantial temperature rise. For instance, in power electronic devices electrical-thermal instability and thermal breakdown could occur within a high temperature region.

In the one-layered micro-channel heat sink design, increasing the pressure drop across the channels can control bulk temperature rise along the channels. A larger pressure drop forces coolant to move faster through the channel, thereby requiring more powerful pumping power supply, generating more noise, and requiring bulkier packaging. Two-phase micro-channel heat sink is an alternative method for eliminating the temperature variations, in which the utilization of latent heat can achieve a uniform temperature profile on the heating surface. However, a two-phase scheme can have several drawbacks, such as a complicated structure and a much larger pressure drop required for the gas-liquid mixture to flow inside the minute conduits.

The present invention reduces the undesired temperature variation in the streamwise direction for the micro-channel heat sink by a design improvement, instead of increasing the pressure drop. The design in the present invention is based upon stacking two layers of micro-channel heat sink structures, one atop the other, with coolant flowing in the opposite direction in each of the micro-channel layers. For such an arrangement, streamwise temperature rise for the coolant and the substrate in each layer may be compensated through conduction between the two layers, resulting in a substantially reduced temperature gradient. The flow loop can be similar to the one designed for the one-layered micro-channel heat sink, except that the flow loop should bifurcate to allow the coolant to flow from opposite, or the same directions, into each of the channels.

In the present invention, the thermal performance of the proposed two-layered micro-channel heat sink is examined numerically using a finite element method and optimization issues for design parameters are addressed as well. Although a one-layered micro-channel heat sink has been extensively studied, the proposed two-layered structure concept has never been reported.

Although described with respect to the fields of electronics and microelectronics, it will be appreciated that similar advantages of a high performance and compact cooling scheme may obtain in other applications of the present invention. Such advantages may become apparent to one of ordinary skill in the art in light of the present disclosure or through practice of the invention.

SUMMARY OF THE INVENTION

The present invention includes heat sinks, heat sink devices, and heat sink systems. The present invention may also be used as a heat source, a heat source device, and in heat source systems, in accordance with methods of heat transfer known to one skilled in the art. The invention also includes machines or electronic devices using these aspects of the invention. The present invention may also be used to upgrade, repair or retrofit existing machines or electronic devices or instruments of these types, using methods and components known in the art.

In broadest terms, the two-layered micro-channeled heat sink (or heating) device of the present invention comprises: (1) a first layer comprising a duality of micro-channels in thermal contact with a heat-generating (or in the case of use as a heating device, with a heat absorbing) surface, (2) a second layer of micro-channels in thermal contact with the first layer, and (3) a device for circulating a coolant (or heating fluid) through the first and second layers such that the coolant (or heating fluid) flows through the first and second layers in opposing directions (or in the same direction).

The heat sink (or heating device) may be made of any appropriate material consistent with its intended function as reflected in the present disclosure. For instance, the channel walls may be made of silicon. The system can be augmented by the addition of any related device, including a cooling (or heating) device, a heat exchange device, a coolant (or heating fluid) filter, a coolant (or heating fluid) reservoir, and a flow-generating device. Typically, the dimensions of the individual micro-channels should be less than one-sixteenth of an inch in height and width, and comparable to the size of the heat-generating (or heat absorbing) substrate in length. EDM is an example of a technique that may be used to create these micro-channels, among other methods of micro-machining known to one of ordinary skill in the art.

Also included in the present invention is, in broadest terms, an electronic device in thermal contact with a two-layered micro-channeled heat sink (or heat source) device, where the heat sink (or heat source) device comprises: (1) electronic circuitry capable of generating (or absorbing) heat; (2) a first layer comprising a duality of micro-channels in thermal contact with a heat-generating surface or surface to be heated, (3) a second layer of micro-channels in thermal contact with the first layer, and (4) a device for circulating a coolant (or heating fluid) through the first and second layers such that the coolant (or heating fluid) flows through the first and second layers in opposing directions (or in the same direction).

The heat sink (or heating device) in thermal contact with the electronic device may similarly be made of any appropriate material consistent with its intended function as reflected in the present disclosure, such as silicon. The system can also be augmented by the addition of a related device, such as a cooling (or heating) device, heat exchange device, coolant (or heating fluid) filter, coolant (or heating fluid) reservoir, or flow-generating device. The dimensions of the individual micro-channels should be less than one-sixteenth of an inch in height and width, and comparable to the size of the electronic circuitry in length.

DETAILED DESCRIPTION OF THE PREFERRED EMBODIMENT(S)

Figure 1A:
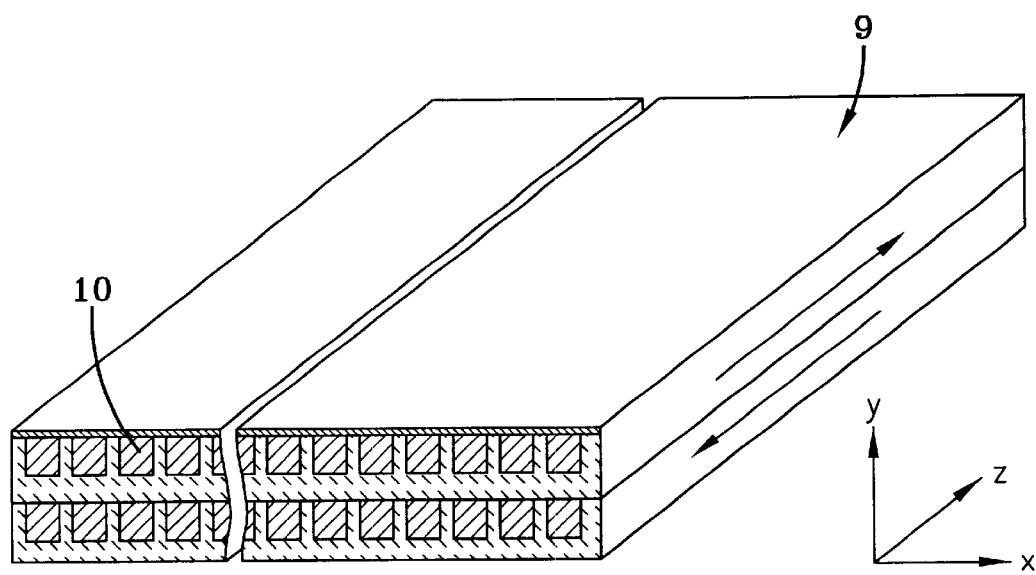
FIG. 1 is (a) a schematic for the two-layered micro-channel heat sink concept and (b) shows one embodiment of the cooling set-up for the proposed two-layered structure.
Figure 1B:
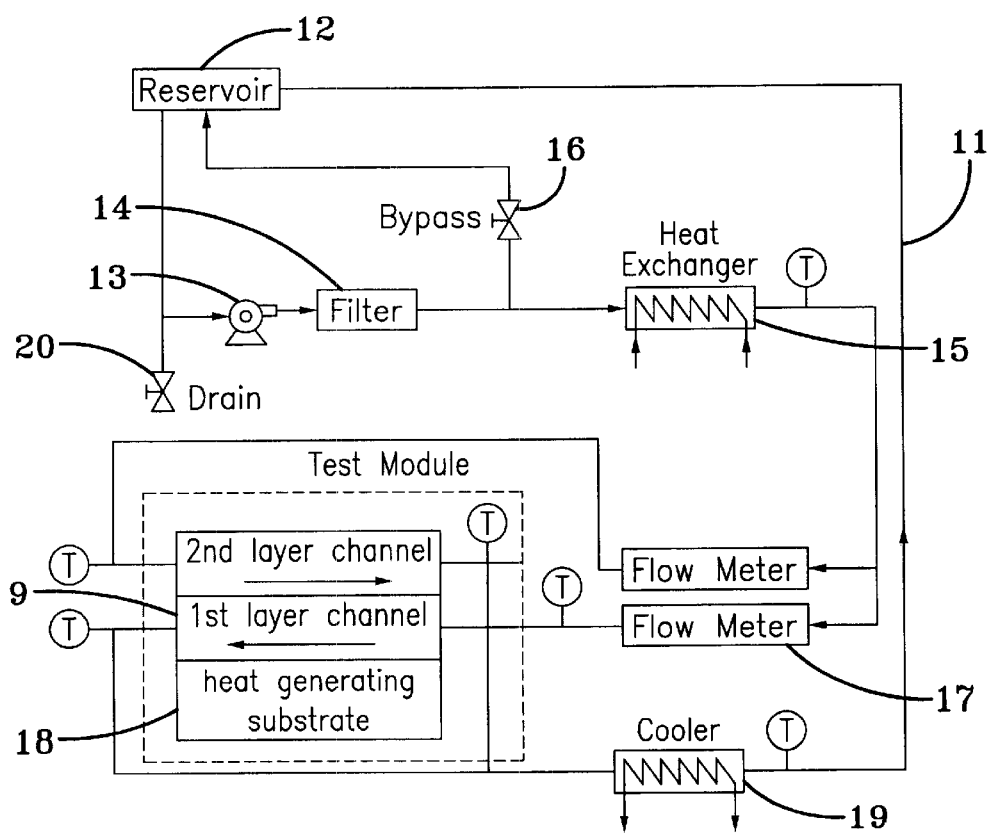

Referring to FIG. 1(a) a two-layered heat sink 9 where each layer is comprised of several micro-channels 10 is shown. The heat sink 9 may be made from a conductive material such as silicon. The cooling setup 11 for the two-layered heat sink 9 is shown in FIG 1(b). Coolant is drawn from a coolant reservoir 12 by a flow-transporting device 13. The coolant is passed through a coolant filter 14 to either a heat exchanger 15 or through a bypass valve 16 back to the reservoir 12. Coolant passing through the heat exchanger 15 is then bifurcated into two separate paths of flow, each path passing coolant through a separate flow meter 17. Each flow path is then passed through one of the layers of the heat sink 9 which is in thermal contact with a heat-generating substrate 18. After passing through the micro-channels of each layer, the coolant passes through a cooler 19 and is then sent back to the coolant reservoir 12. A drain 20 is also provided to allow the changing of coolant. The ratio of coolant volume flow rate through each layer may be varied.

MATERIALS AND METHODS

Optimization of the Heat Sink: The parameters that are used to evaluate the thermal performance of a heat sink are the normal and the streamwise thermal resistances. The normal thermal resistance is defined as $$R^n_{th} = \Delta T^n_{max}/q$$

where $\Delta T^n_{max}$ is the maximum temperature rise from the coolant in the bottom channel to the bottom surface of the heat sink that is attached to the heat-generating chips and q is the heat flux at the bottom surface. The streamwise thermal resistance is related to the rate of the streamwise temperature gradient and the applied heat flux, and is defined by $$R^z_{th} = \Delta T^z_{max}/q$$

where $\Delta t^c_{max}$ denotes the maximum temperature increase along the z direction on the bottom surface of the silicon.

The task of optimization is to find the optimal design parameters that would minimize the cited two thermal resistances in the normal and streamwise directions. Pertinent geometrical parameters related to the thermal performance of a two-layered micro channel heat sink are the ratio of channel height to channel width, the ratio of fin width to the channel width, the size of the channels, and the streamwise channel length of the heat sink. It has been established that in the one-layered structure, smaller channel size and larger ratio of channel height to width can reduce the normal thermal resistance, as long as such a design will satisfy the structural consideration. These observations are also valid for two-layered structures. It has been reported that the optimal ratio of channel width to fin width is about 1.0 for the one-layered structure. This result may not be true for a two-layered design because the heat dissipation pattern through the channel and the fin, as discussed previously, are quite different between the one-layered and two-layered structures.

Figure 7:
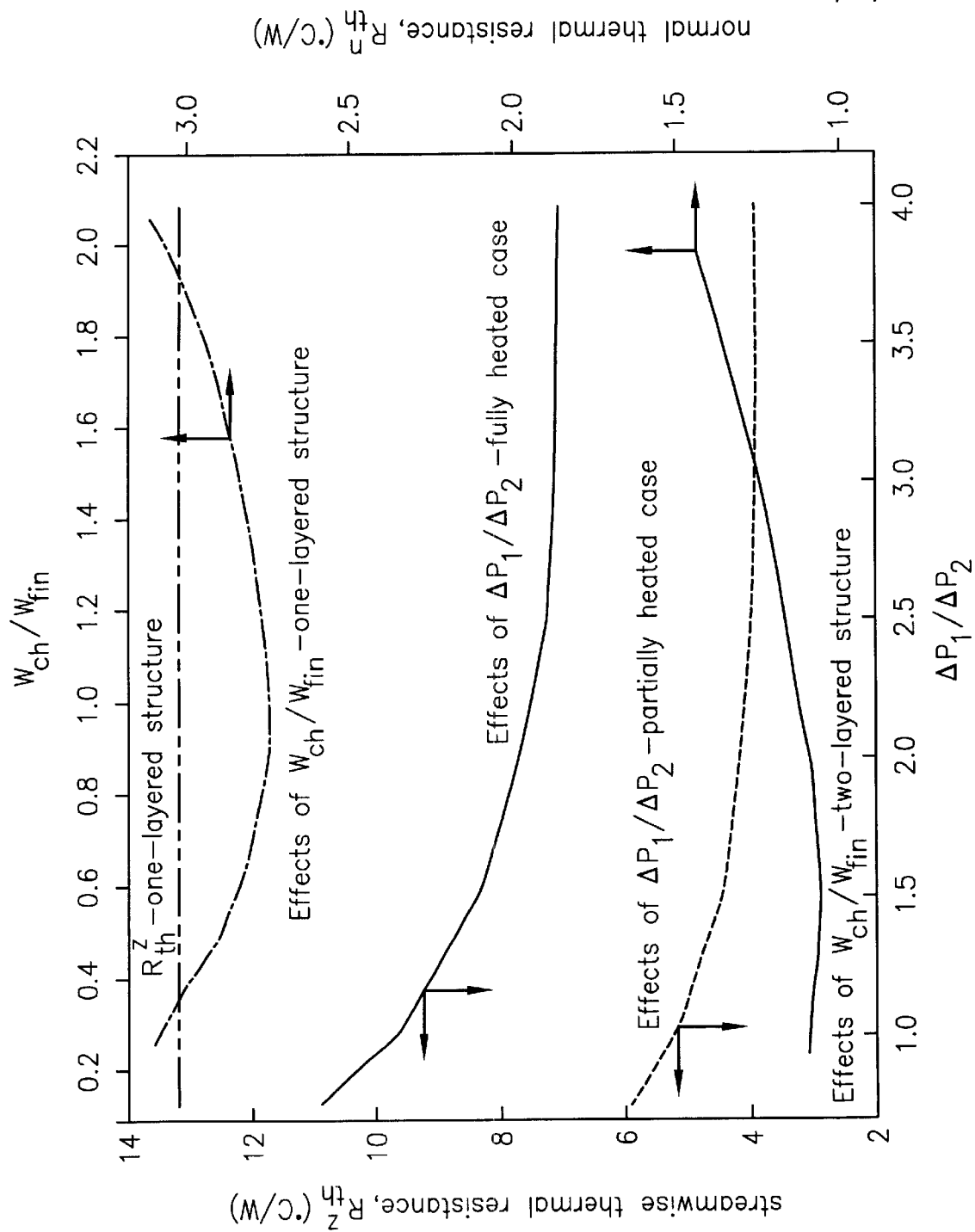
FIG. 7 shows the effects of $W_{ch}/W_{fin}$ and $\Delta P_1/\Delta P_2$, on the normal and streamwise thermal resistances.

The effects of the $W_{ch}/W_{fin}$ on the normal thermal resistance, $R^n_{th}$, is shown in FIG. 7 for both the two-layered and the one-layered structures under the same operating conditions. It should be noted that $W_{ch}/W_{fin}$ variations did not have a significant impact on the streamwise thermal resistance, $R^n_{th}$. In the two-layered structure, the minimum $R^n_{th}$ is obtained at the $W_{ch}/W_{fin}$ ratio of 0.6, compared to 1.0 for the one-layered structure. This means that the fins for an optimal two-layered micro channel heat sink may be thicker than the fins of the one-layered structure having the same patch width. The reason for this difference in fin thickness is that the fin for the bottom layer in the two-layered structure transports a higher percentage of heat (to both the bottom and top channels) than the fin for the one-layered structure; and a thicker fin apparently facilitates this heat transfer. It should be noted that the normal thermal resistance varies only slightly in the range of $W_{ch}/W_{fin}$ less than 0.6. Considering the difficulty of fabrication of smaller channels, $W_{ch}/W_{fin}$ of 0.6 is therefore recommended as the optimal ratio for the practical design of a two-layered micro channel heat sink.

The effects of the ratio of the pressure drops in the bottom and top layer, $\Delta P_1/\Delta P_2$ on the streamwise thermal resistance, $R^z_{th}$, for both the one-layered and two-layered structures are also plotted in FIG. 7. It should be noted that $\Delta P_1/\Delta P_2$ variations did not have a significant impact on the normal thermal resistance, $R^n_{th}$. In order to compare the two cases, the same heat flux is again used for both cases and the flow rate used for the one-layered case is set equal to the sum of the flow rates in the top and the bottom layers for the two-layered case. It should be noted that for the one-layered channels, the amount of heat carried out by the coolant flow is proportional to the flow rate, which in turn is proportional to the pressure drop applied across the channels. For the two-layered channels, given the total amount of the flow rate of coolant in both channels, it requires knowledge of the optimal pressure drop ratio that can minimize the streamwise thermal resistance. It can be observed in FIG. 7 that as $\Delta P_1/\Delta P_2$ increases from 0.7 to about 3.0, the streamwise thermal resistance rate decreases significantly from 17.2° C./cmW to 11.4° C./cmW. Further increase of this pressure ratio does not significantly reduce the thermal resistance. Based on this fact, a pressure ratio of 2.5–3.0 is recommended as an optimal ratio for a practical two-layered design. This optimal pressure ratio is also found to hold true for the partially heated cases as shown in FIG. 7.

Figure 8:
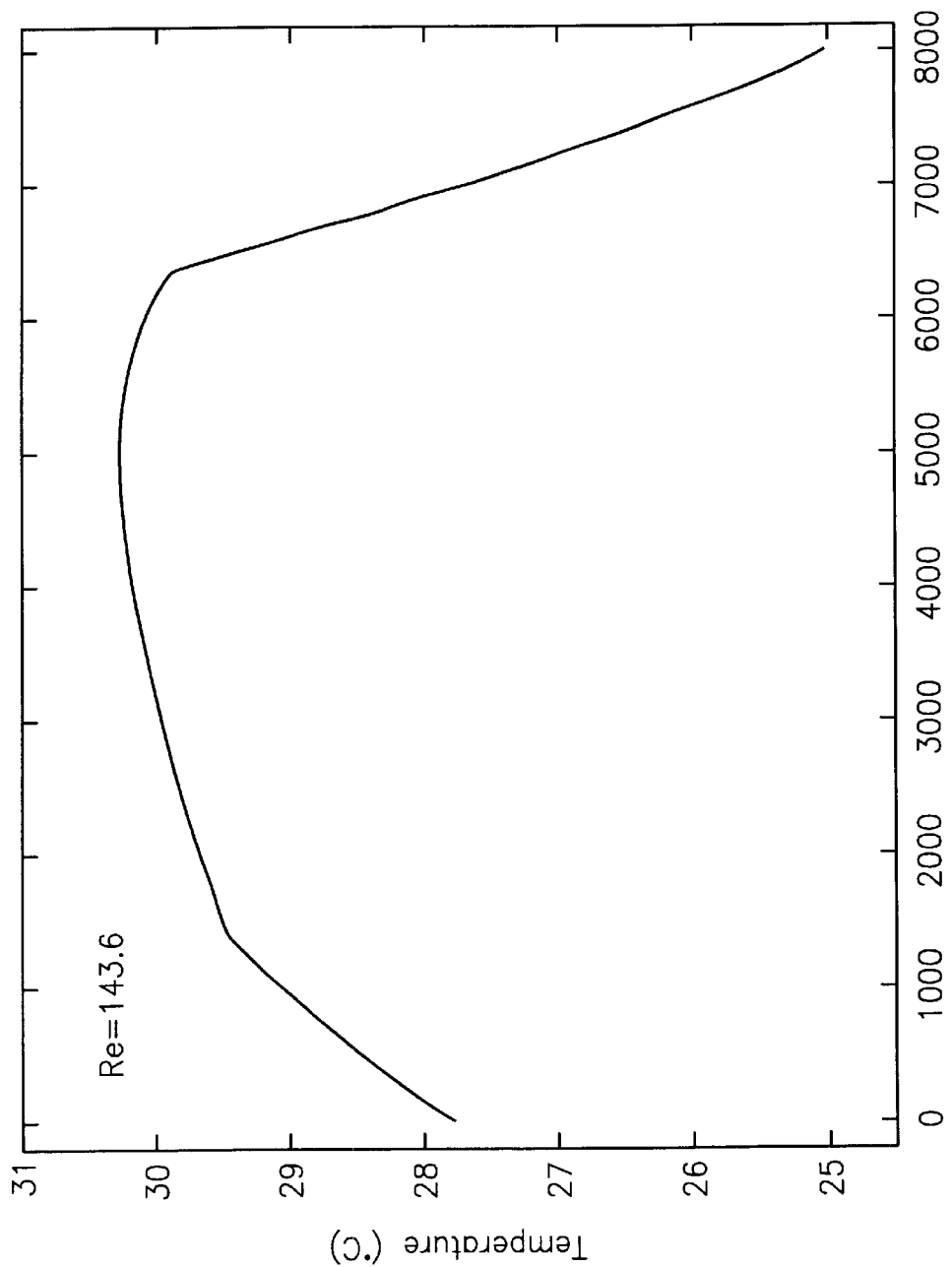
FIG. 8 shows the streamwise temperature distribution for partially heated cases.

Another geometric parameter that can be optimized in the design of a two-layered micro channel heat sink is the channel length. The streamwise temperature distribution in FIG. 6 indicates that a large portion of the temperature rise occurs at the two ends of the channels. This is due to relatively intense heat transfer between the low-temperature coolant of one layer at its inlet and the high-temperature coolant of the opposite layer at its outlet, within a short distance. This implies that the two-layered micro channel can be constructed with a longer length in the streamwise direction, so that the heat-generating semiconductor chips can be mounted in the mid section of the heat sink to avoid the two high temperature gradient regions at both ends of the channels. This idea is implemented in our calculations by modifying the boundary condition at the bottom of the heat sink to one of partial heating, specifically, three-fifth of the total length at the mid section of the channel is exposed to heat flux. FIG. 8 shows the streamwise temperature distribution at x=40 and y=0 (at the bottom surface) of this partially heated case. The overall channel length is kept at 8000 $\mu$m, which is the same as the length used for the fully heated case. The heated region is restricted from z=1600 $\mu$m to z=6400$\mu$m. All other parameters are kept the same as for the fully heated case discussed previously. The temperature increases from 27.6° C. to 29.5° C. and decreases from 29.7° C. to 25.0° C. within the two end regions. In the heated region where the semiconductor chip is mounted, the temperature variation is only about 0.5° C. This demonstrates that a longer micro channel design can indeed substantially reduce the streamwise temperature variation. It should be pointed out that the one-layered design does not have these characteristics. A longer channel length in the one-layered structure will not affect the streamwise temperature rise due to the absence of the heat transfer mechanism between the coolant flows within the top and the bottom layers.

DISCUSSION

Figure 2:
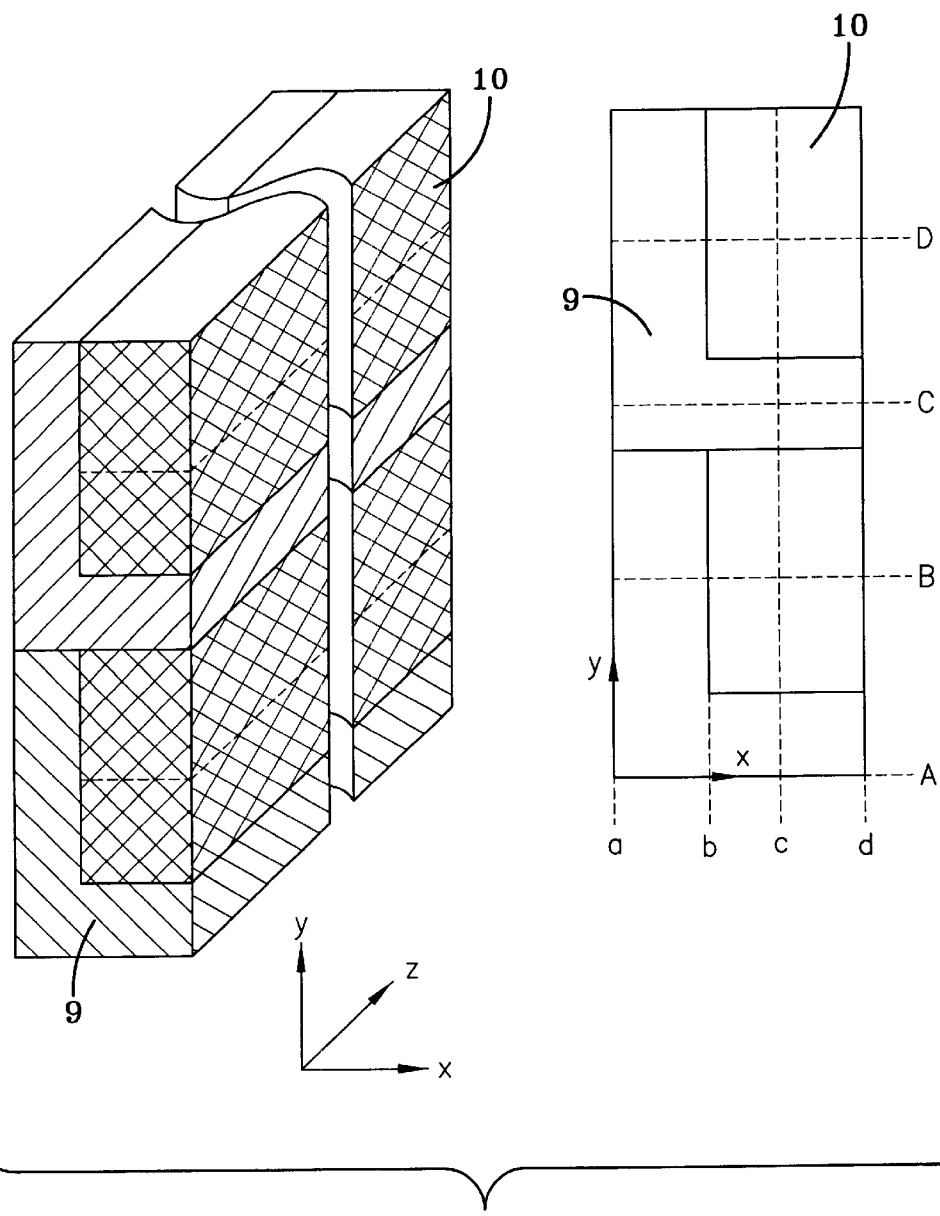
FIG. 2 shows the computational domain based on symmetry considerations.

As shown in FIG. 2, the heat sink has two layers of rectangular channels and fins. The width and height of each of the channels are $2W_{ch}$ and $H_{ch}$ respectively. The width and height of each of the vertical fins are $2W_{fin}$ and $H_{ch}$ and the width and height of each of the horizontal fins are $2(W_{fin}+W_{ch})$ and $H_{ba}$ respectively. The length of the channel in the streamwise direction is L. Flow in the bottom channel is along the z direction and flow in the top channel is opposite to the z direction.

Previous numerical works on the one-layered microchannel heat sink are mostly based on a two-dimensional model. However, a three-dimensional model is necessary in this work because the temperature distribution in the two-layered structure is expected to be three-dimensional, along with a non-linear distribution in a streamwise direction. For the fin region shown in FIG. 2, the three dimensional conduction equation with constant thermal conductivity as given below is utilized.

$$\Delta^2 T = 0$$

The flow in each of the micro-channels is assumed to be unidirectional. That is, the inlet and outlet hydraulic effects may be neglected. This assumption can be justified by noting that the inlet and the outlet dimensions of the microchannel's cross section are at least one order of magnitude less than the length of the channel. This allows the attainment of an analytical expression for the velocity profile. The temperature distribution within the micro channel can then be obtained from the following energy equation $$w\rho c_p(\partial T/\partial z) = k\nabla^2 T + \mu[(\partial w/\partial x)^2 + (\partial w/\partial y)^2]$$

where w is the streamwise velocity component. As mentioned before, the velocity distribution inside the channel, w, can be obtained analytically as $$w(x, y) = (48/\Pi^3) \sum_{i=1}^{\infty} (-1)^{i-1}$$

$$\{1 - (\cosh[\Pi(2i-1)x/H_{ch1,2}]/\cosh[\Pi(2i-1)W_{ch}/H_{ch1,2}])\} *$$

$$\{\cosh[\Pi(2i-1)W_{ch}/H_{ch1,2}]/(2i-1)^2\} / \left\{1 - (96/\Pi^5)\right.$$

$$\left. (H_{ch1,2}/W_{ch}) \sum_{j=1}^{\infty} (\tanh[\Pi(2i-1)W_{ch}/H_{ch1,2}]/(2i-1)^5)\right\}$$

where the average velocity is given by $$\bar{w} = -(H_{ch1,2}^2/12\,\Pi)(dp/dz)$$

$$\left\{1 - (96/\Pi^5)(H_{ch1,2}/W_{ch}) \sum_{j=1}^{\infty} (\tanh[\Pi(2i-1)W_{ch}/H_{ch1,2}]/(2i-1)^5)\right\}$$

and where $W_{ch}$ is the channel width and $H_{ch1,2}$ is the channel height for either the lower or upper layer.

Based on the symmetry conditions, the central surface of the fin and the channel are taken as adiabatic. The top surface of the system is assumed to be adiabatic as well, because thermally insulated materials usually cover it. A uniform heat flux, q is applied to the bottom of the composite micro-channel which is attached to the heat generating chip. The coolant is assumed to enter each of the micro-channels at a constant temperature. Adiabatic conditions are utilized at the exits of each of the micro-channels. This is because conductive heat transfer at the exit is estimated to be less than 1% of the imposed heat transfer at the bottom surface. The micro-channel heat sink is presumably made of silicon, and water is used as the coolant.

The Reynolds Number (Re) is defined in the usual manner as $$Re = \bar{\rho} w D_{1,2}/\mu$$

where $D_{1,2}$ are the hydraulic diameters of the lower and the upper channels, respectively, which are defined by $$D_{1,2} = (4W_{ch}H_{ch1,2})/(W_{ch}+H_{ch1,2})$$

The numerical scheme is based on the finite element discretization using Galerkin Method of weighted residuals.

Eight-node iso-parametric brick elements are used in the computations. A normal case ran for about four hours on a R-10000 silicon graphic workstation.

Figure 3A:
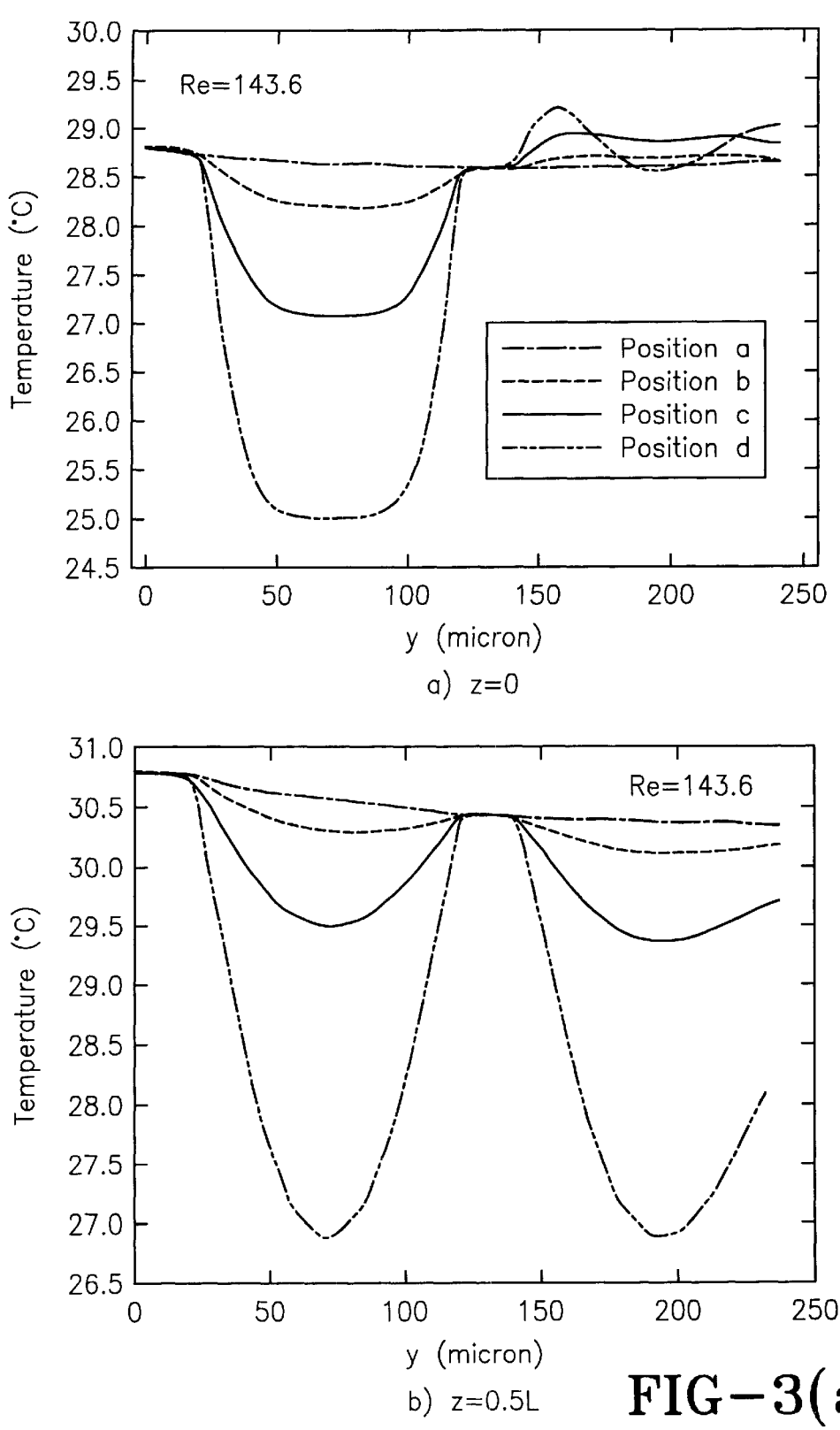
FIG. 3 shows the temperature distribution in normal (y) direction at different x and z locations.
Figure 3B:
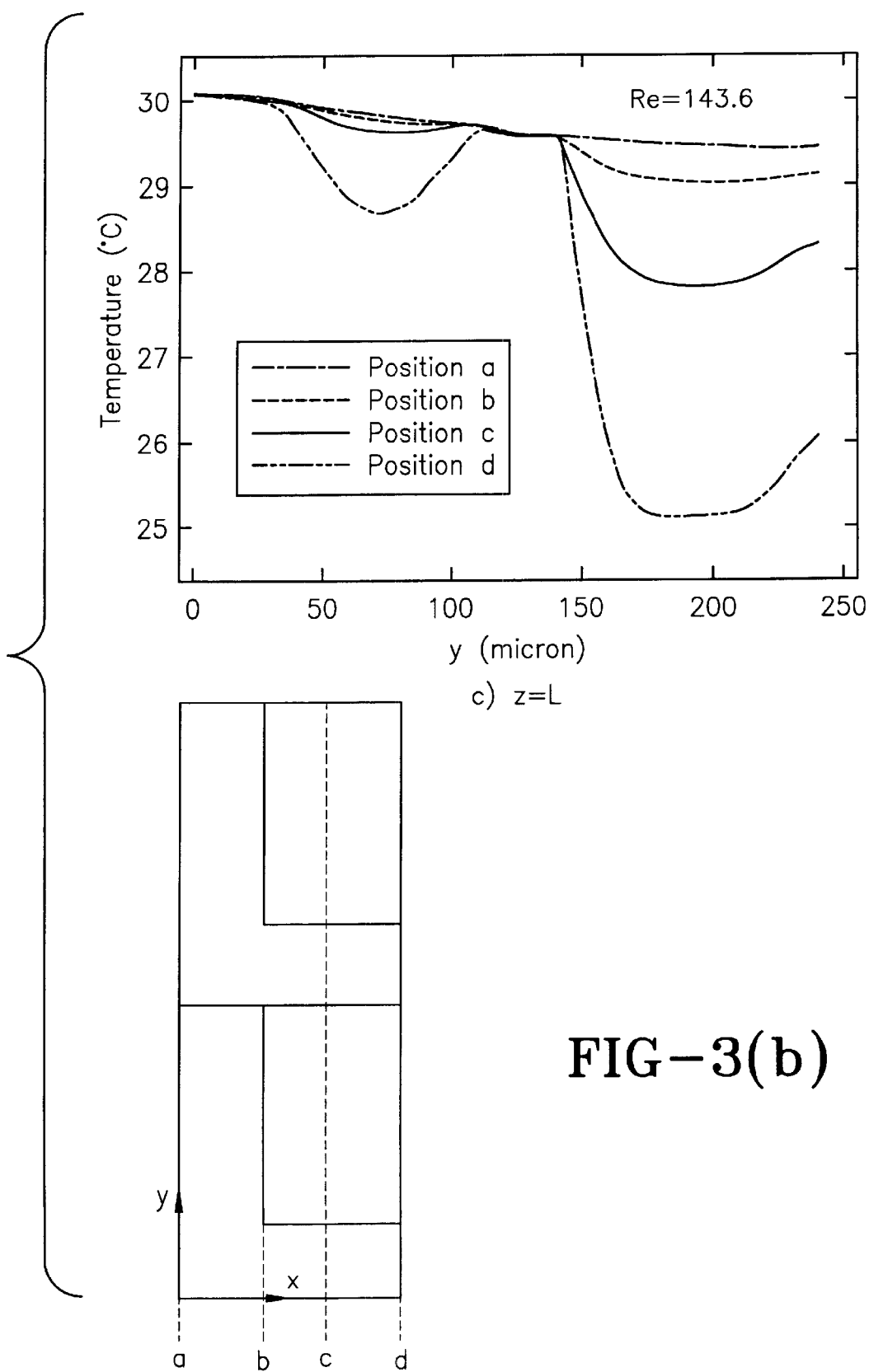

The temperature profiles in the y direction at various x and z locations are plotted in FIG. 3. The parameters used in generating FIGS. 3, 4, 5 and 6 which are based on some typical generic conditions for these type of applications are listed in Table 1. FIGS. 3a, 3b, 3c correspond to z=0, 0.5L, L which in turn signify the lower layer inlet/upper layer outlet, middle of the channel, and lower layer outlet/upper layer inlet, respectively. The curves in each figure correspond to different x locations labeled as a, b, c and d in FIG. 3.

The temperature in the base section is virtually constant due to the large ratio of the thermal conductivity of silicon to water. This implies that the conduction contribution to the overall thermal resistance in the y direction is insignificant and the thickness of the silicon at the base is not a crucial factor for the thermal performance of the heat sink. The fluid temperature in the central channel domain is basically constant until it reaches the boundary layer region at which point the fluid temperature rises rapidly towards the solid surface temperature.

Due to the conduction effect on the coolant, the upper and lower layers of the fluid have apparent temperature difference. At the two ends of the channels, there are regions where the outlet coolant temperature for one layer is higher than the temperature of the surrounding substrate cooled by the other coolant layer at its inlet. This implies that for each layer, heat dissipates from substrate to coolant at its inlet, as it does in one layered micro-channel heat sink, but in addition heat transfer also occurs from the heated coolant to the substrate around its outlet. This feature is unique and occurs only in the two-layered heat sink design. It is also observed that temperature distribution in the y direction at various z positions is quite different. For example, the temperature in solid domain remains almost constant with height in FIGS. 3b and 3c, but in FIG. 3a, it drops only until the mid-section of the lower channel and then it increases gradually with height. This is also different from a one-layered structure where the temperature profile should be invariant in streamwise distance.

Figure 4A:
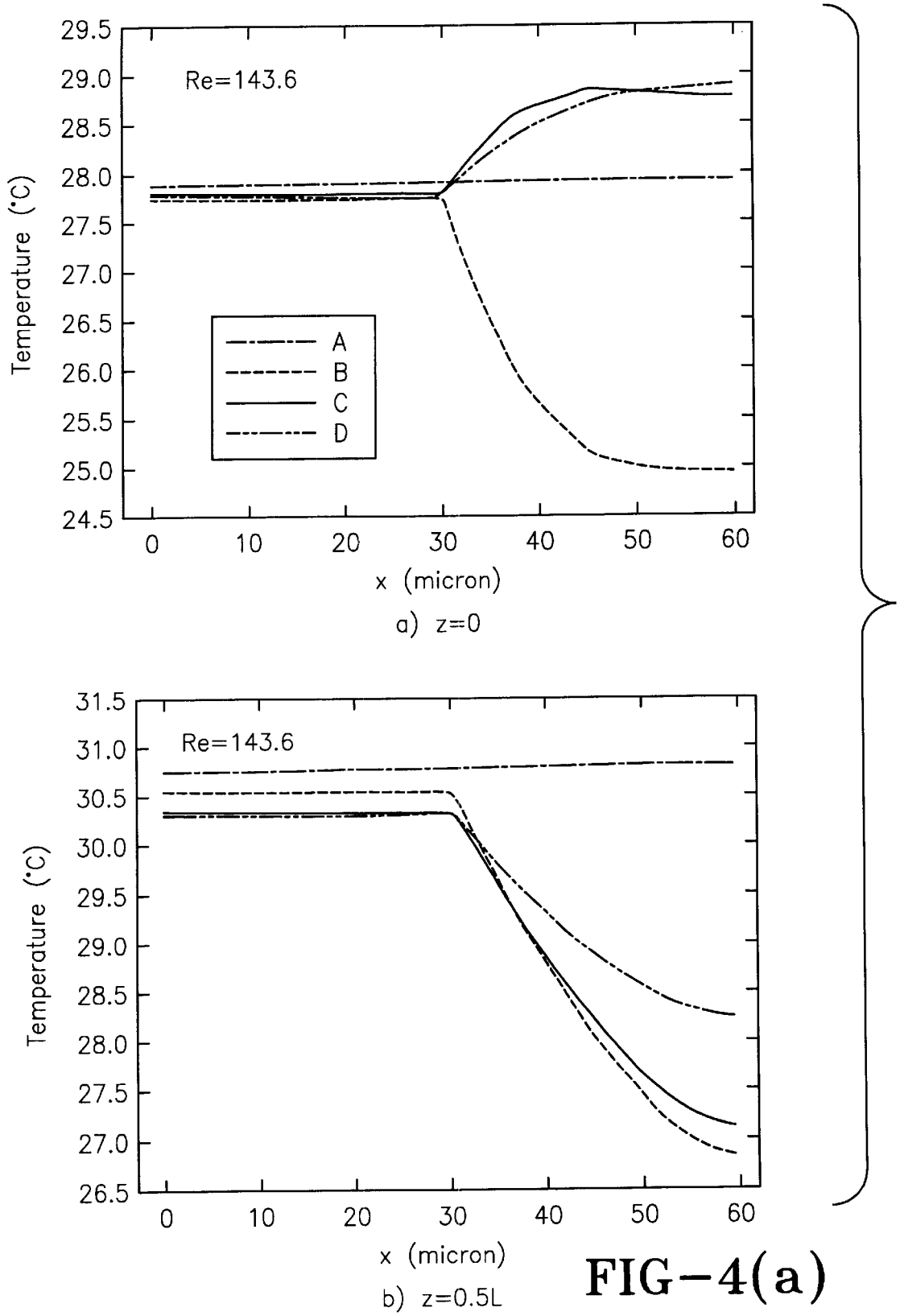
FIG. 4 shows the temperature distribution in x direction.
Figure 4B:
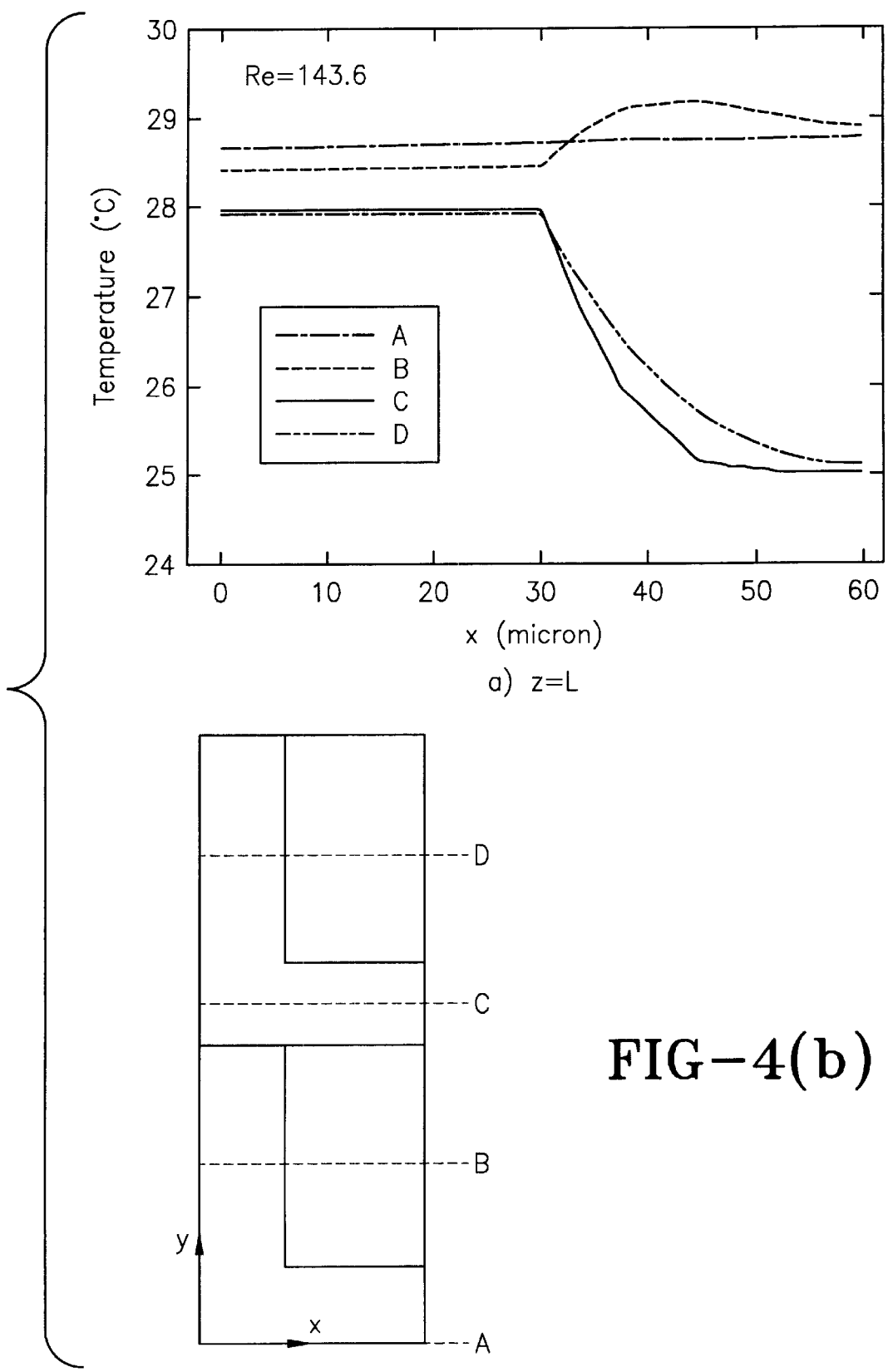

Temperature profiles in the x direction are plotted in FIG. 4. FIGS. 4a, 4b and 4c correspond to different z positions of 0, 0.5L, and L respectively. The curves in each FIG. correspond to different y locations labeled as A, B, C and D in FIG. 4. All curves in FIG. 4 change abruptly at the interface between the fin and the channel. The temperature profiles at the base of the lower layer, as represented by the curves in FIGS. 4a and 4b, display a temperature increase from the central surface of the fin to the central surface of the channel. This is indicative of a heat flux parallel to the base surface, the direction of which is from the channel side to the fin side.

Figure 5:
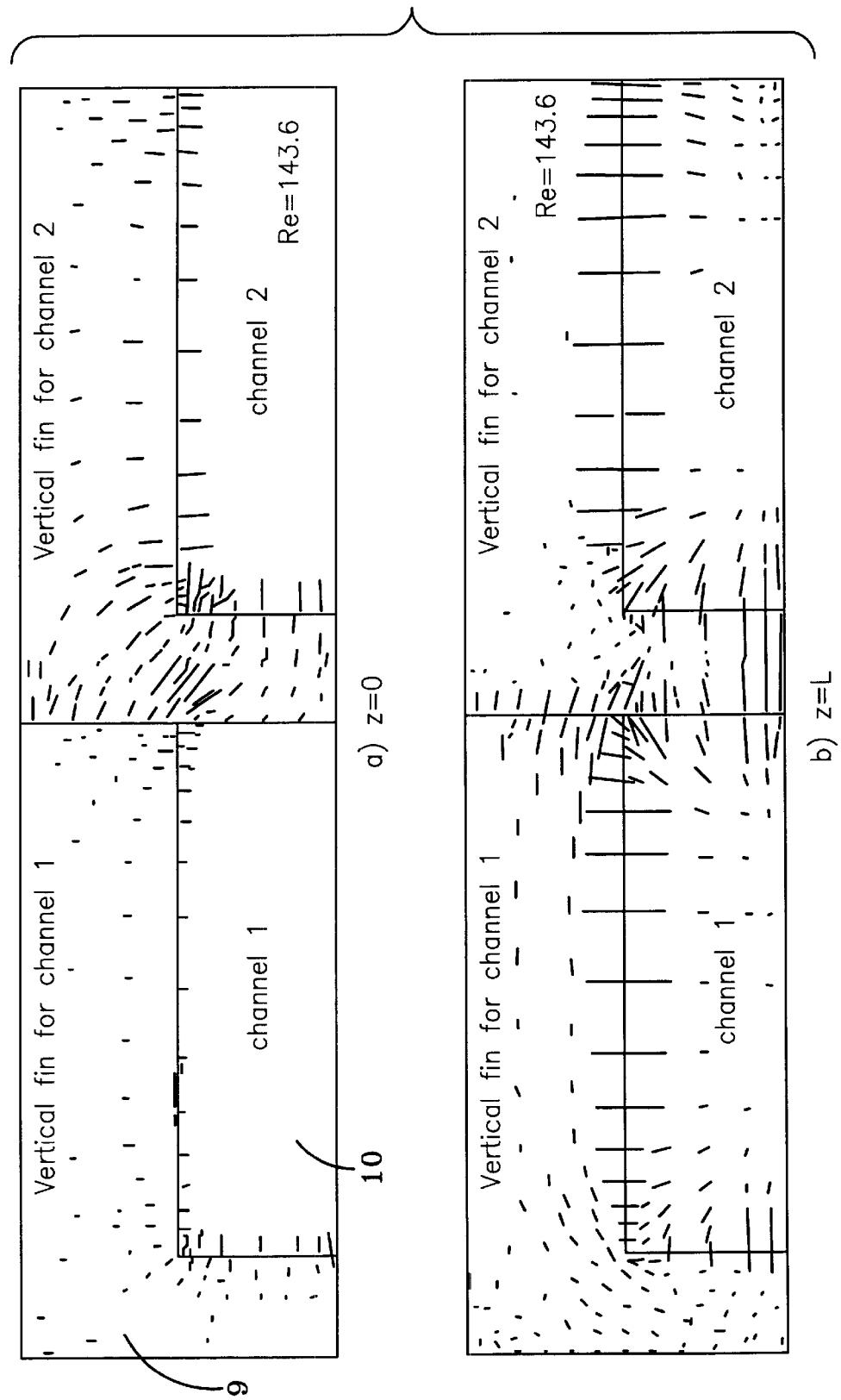
FIG. 5 shows heat flux vector plots at z=O and z=L for Re=143.6.

The heat flux paths suggested in FIG. 4 can be seen clearly in the heat flux vector plots displayed in FIG. 5. FIG. 5 illustrates that the heat input at the bottom surface of the heat sink is dissipated in two ways: a "direct" path which is by conduction through the base layer and convection from the lower layer of the channel; and an "indirect" path which is by conduction through the vertical fin and the upper base layer as well as convection from the upper layer channel. As seen in FIG. 5, the "direct" path dominates the heat transfer process around z=0 whereas around z=L the main heat flux flows through the "indirect" path. This is because around z=0, as seen in FIG. 5a, which corresponds to the lower channel inlet and the upper channel outlet, the coolant in the lower channel is cooler than that in the upper channel, so the "direct" heat flux path is more significant than the "indirect" path. The opposite scenario is the case around z=L as seen in FIG. 5b where the heat flux along the "indirect" path is dominant.

Figure 6A:
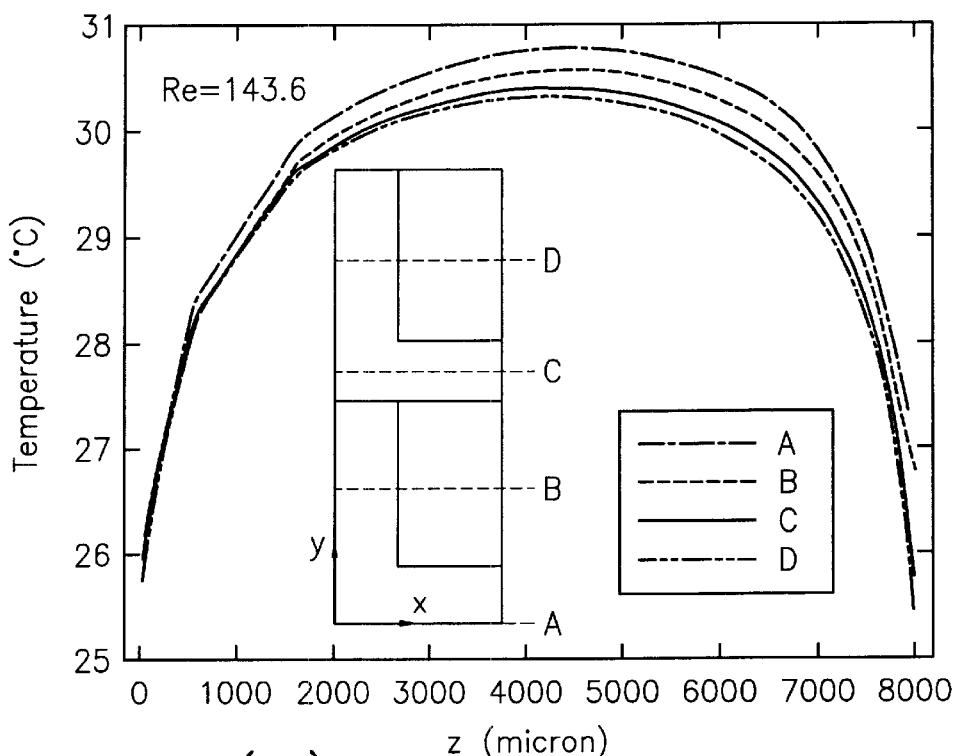
FIG. 6 shows a) the temperature distribution in streamwise (z) direction for the two-layered micro channel heat sink and b) the temperature distribution in streamwise (z) direction for a one-layered micro-channel heat sink
Figure 6B:
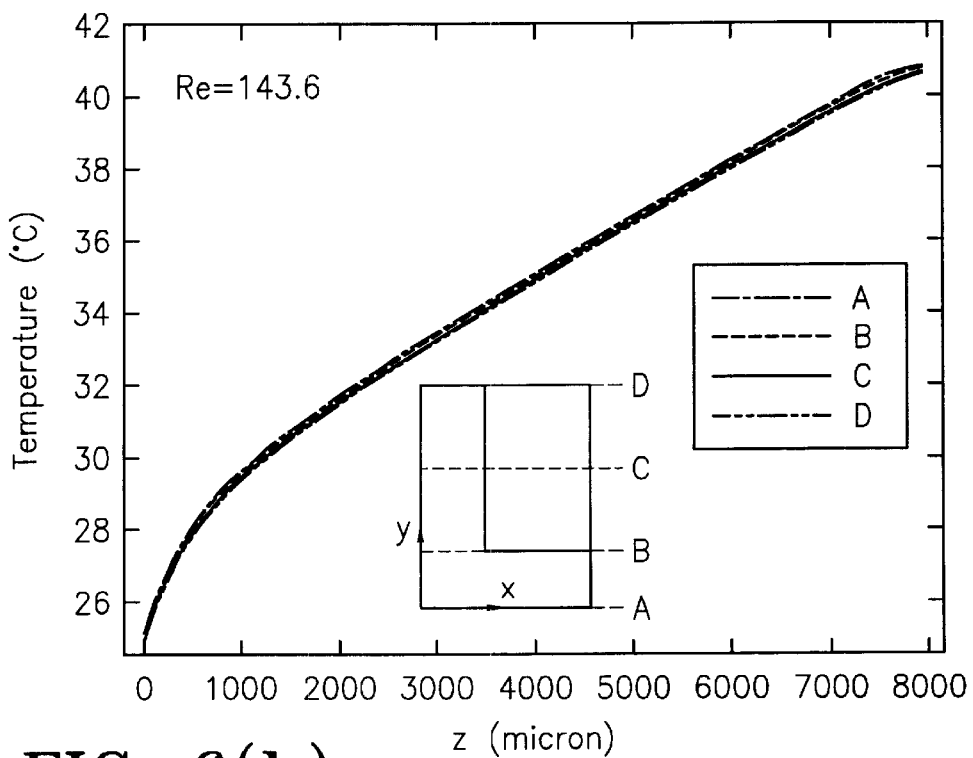

FIG. 6a shows the temperature distribution along the channels, corresponding to the central surface of the fin. The four curves in FIG. 6a correspond to different y locations labeled as A, B, C and D. The results for the streamwise temperature distribution within the one-layered channel structure is shown in FIG. 6b. For comparative purposes, the pressure drop and other parameters are kept the same as those used in the two-layered structure.

As shown in FIG. 6a, the streamwise temperature distribution at different y positions, denoted by the curves A to D, are close to each other, with maximum value occurring approximately at the center of the channels regardless of the y location. The maximum temperature difference in the streamwise direction in the two-layered structure is around 5° C. as seen in FIG. 6a. The benefits of the two layered micro-channel system become apparent when the maximum temperature difference for the two layered system shown in FIG. 6a is compared with that for the one layered channel shown in FIG. 6b. As seen in FIG. 6b, the maximum temperature difference for the one layered micro-channel system is about 15° or about 300% higher than that for the two layered micro-channel system for the same set of parameters. Therefore, the two-layered micro-channel heat sink can reduce the streamwise temperature difference more effectively than the traditional one-layered design.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

REFERENCES

1. D. B. Tuckerman and R. F. W. Pease, High-performance heat sinking for VLSI, *IEEE Electron Device Letter* ED-2, 126–129 (1981)
2. L. J. Missaggia, J. N. Walpole, Z. L. Liau and R. J. Phillips, Micro channel heat sinks for two dimensional high-power-density diode laser arrays, *IEEE Journal of Quantum Electronics* 25, 1988–1992 (1989)
3. M. B. Kleiner, S. A. Kuhn and K. Haberger, High performance forced air cooling scheme employing micro-channel heat exchangers, *IEEE Trans. On Components, Packaging and Manufacturing Technology Part A* 18, 795–804 (1995)
4. V. K. Samalam, Convective heat transfer in micro-channels, *J. of Electronics Materials* 18, 611–17 (1989)
5. A. Weisberg, H. H. Bau and J. Zemel, Analysis of micro-channels for integrated cooling, *Int. J. Heat & Mass Transfer* 35, 2465–74 (1992)
6. M. B. Bowers and I. Mudawar, Two-phase electronic cooling using mini-channel and micro-channel heat sinks:

part I- design criteria and heat diffusion constraints, *Trans. of the ASME, J of Electronic Packaging* 116, 290–7 (1994)

7. R. W. Knight, D: J. Hall, J. S. Goodling, and R. C. Jaeger, Heat sink optimization with application to micro-channels, *IEEE Trans. Components, Hybrids and Manufacturing Technology* 15, 832–42 (1992)

What is claimed is:

1. A two-layer micro-channel heat sink for use with a heat generating surface comprising:
    a first layer comprising an input, an output, and at least one micro-channel disposed between said input of said first layer and said output of said first layer, each said at least one microchannel of said first layer for transporting a first flow of coolant from said input of said first layer to said output of said first layer, said first layer in thermal contact with said heat-generating surface;
    a second layer comprising an input, an output, and at least one micro-channel disposed between said input of said second layer and said output of said second layer, each said at least one micro-channel of said second layer for transporting a second flow of coolant from said input of said second layer to said output of said second layer, said second layer adjacent to and in thermal contact with said first layer, wherein said second flow of coolant flows in a direction opposite said first flow of coolant;
    a flow splitting junction, said flow splitting junction adapted to receive a common flow of coolant and to split said common flow of coolant into a first flow and a second flow, said flow splitting junction in fluid communication with said input of said first layer and said input of said second layer;
    a flow combining junction, said flow combining junction in fluid communication with said output of said first layer and said output of said second layer, said flow combining junction adapted to receive said first flow of coolant and said second flow of coolant and to combine said first and second flow of coolant into a common flow of coolant; and
    a device for supplying said flow splitting junction with said common flow of coolant and for receiving said common flow of coolant from said flow combining junction so as to circulate coolant across said first layer and said second layer.

2. A two-layered micro-channel heat sink according to claim 1 further comprising a cooling device attached to said coolant circulating device whereby excess heat is removed from said coolant.

3. A two-layered micro-channel heat sink according to claim 1 further comprising a heat exchanging device attached to said coolant circulating device whereby excess heat is removed from said coolant.

4. A two-layered micro-channel heat sink according to claim 1 further comprising a coolant filter attached to said coolant circulating device whereby impurities may be removed from said coolant.

5. A two-layered micro-channel heat sink according to claim 1 further comprising a coolant reservoir attached to said coolant circulating device whereby coolant can be stored for later use in said heat sink.

6. A two-layered micro-channel heat sink according to claim 1 wherein said heat sink comprises a heat-conducting material selected from the group consisting of silicon.

7. A two-layered micro-channel heat sink according to claim 1 wherein said micro-channels individually comprise dimensions less than one-sixteenth of an inch in width and height and proportional to said heat generating surface in length.

8. An electronic device, said device in thermal contact with a two-layered micro-channeled heat sink device, said device comprising:
    electronic circuitry capable of generating heat; a first layer comprising an input, an output, and at least one micro-channel disposed between said input of said first layer and said output of said first layer, each said at least one micro-channel for transporting a first flow of coolant from said input of said first layer to said output of said first layer, said first layer in thennal contact with said electronic circuitry;
    a second layer comprising an input, an output, and at least one micro-channel disposed between said input of said second layer and said output of said second layer, each said at least one micro-channel of said second layer for transporting a second flow of coolant from said input of said second layer to said output of said second layer, said second layer adjacent to and in thermal contact with said first layer, wherein said second flow of coolant flows in a direction opposite said first flow of coolant;
    a flow splitting junction, said flow splitting junction adapted to receive a common flow of coolant and to split said common flow of coolant into a first flow and a second flow, said flow splitting junction in fluid communication with said input of said first layer and said input of said second layer;
    a flow combining junction, said flow combining junction in fluid communication with said output of said first layer and said output of said second layer, said flow combining junction adapted to receive said first flow of coolant and said second flow of coolant and to combine said first and second flow of coolant into a common flow of coolant; and
    a device for supplying said flow splitting junction with said common flow of coolant and for receiving said common flow of coolant from said flow combining junction so as to circulate coolant across said first layer and said second layer.

9. A two-layered micro-channel heat sink according to claim 8 further comprising a cooling device attached to said coolant circulating device whereby excess heat is removed from said coolant.

10. A two-layered micro-channel heat sink according to claim 8 further comprising a heat exchanging device attached to said coolant circulating device whereby excess heat is removed from said coolant.

11. A two-layered micro-channel heat sink according to claim 8 further comprising a coolant filter attached to said coolant circulating device whereby impurities may be removed from said coolant.

12. A two-layered micro-channel heat sink according to claim 8 further comprising a coolant reservoir attached to said coolant circulating device whereby coolant can be stored for later use in said heat sink.

13. A two-layered micro-channel heat sink according to claim 8 wherein said heat sink comprises a heat-conducting material selected from the group consisting of silicon.

14. A two-layered micro-channel heat sink according to claim 8 wherein said micro-channels individually comprise dimensions less than one-sixteenth of an inch in width and height and proportional to electronic circuitry in length.

* * * * *